US009245882B2

(12) United States Patent
Ching et al.

(10) Patent No.: US 9,245,882 B2
(45) Date of Patent: Jan. 26, 2016

(54) FINFETS WITH GRADIENT GERMANIUM-CONTAINING CHANNELS

(71) Applicant: Taiwan Semiconductor Manufacturing Company, Ltd., Hsin-Chu (TW)

(72) Inventors: Kuo-Cheng Ching, Zhubei (TW); Zhiqiang Wu, Chubei (TW); Jiun-Jia Huang, Beigang Township (TW); Chao-Hsiung Wang, Hsin-Chu (TW); Chi-Wen Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/040,319

(22) Filed: Sep. 27, 2013

(65) Prior Publication Data
US 2015/0091099 A1    Apr. 2, 2015

(51) Int. Cl.
*H01L 21/8234* (2006.01)
*H01L 27/088* (2006.01)

(52) U.S. Cl.
CPC .... *H01L 27/0886* (2013.01); *H01L 21/823431* (2013.01)

(58) Field of Classification Search
CPC ................ H01L 27/0886; H01L 21/823431
USPC ........................................... 257/401; 438/283
See application file for complete search history.

(56) References Cited

U.S. PATENT DOCUMENTS

| | | | | |
|---|---|---|---|---|
| 2006/0038241 A1* | 2/2006 | Matsuo | ........................ | 257/401 |
| 2007/0241399 A1* | 10/2007 | Irisawa et al. | ................. | 257/347 |
| 2008/0020532 A1* | 1/2008 | Monfray et al. | ............. | 438/285 |
| 2013/0249003 A1* | 9/2013 | Oh et al. | ........................ | 257/347 |
| 2014/0027860 A1* | 1/2014 | Glass et al. | ..................... | 257/401 |
| 2014/0030876 A1* | 1/2014 | Flachowsky et al. | ......... | 438/479 |
| 2014/0170839 A1* | 6/2014 | Brunco | ......................... | 438/479 |
| 2014/0217483 A1* | 8/2014 | Choi et al. | ..................... | 257/288 |
| 2014/0252475 A1* | 9/2014 | Xu | ................................. | 257/347 |

* cited by examiner

*Primary Examiner* — Christine Enad
(74) *Attorney, Agent, or Firm* — Slater & Matsil, L.L.P.

(57) ABSTRACT

A method includes forming a semiconductor fin, forming a dummy gate on a top surface and sidewalls of the semiconductor fin, and removing the dummy gate to form a recess. The semiconductor fin is exposed to the recess. After the dummy gate is removed, an oxidation is performed on the semiconductor fin to form a condensed germanium-containing fin in the recess, and a silicon oxide layer on a top surface and sidewalls of the condensed germanium-containing fin. The method further includes forming a gate dielectric over the condensed germanium-containing fin, and forming a gate electrode over the gate dielectric.

20 Claims, 25 Drawing Sheets

FINFETS WITH GRADIENT GERMANIUM-CONTAINING CHANNELS

BACKGROUND

The speed of metal-oxide-semiconductor (MOS) transistors are closely related to the drive currents of the MOS transistors, which drive currents are further closely related to the mobility of charges in the channels of the MOS transistors. For example, NMOS transistors have high drive currents when the electron mobility in their channel regions is high, while PMOS transistors have high drive currents when the hole mobility in their channel regions is high. Germanium, silicon germanium, and compound semiconductor materials (referred to as III-V compound semiconductors hereinafter) comprising group III and group V elements are thus good candidates for forming MOS devices due to their high electron mobility and/or hole mobility.

Germanium, silicon germanium, and III-V compound semiconductor regions are also promising materials for forming the channel regions of Fin Field-Effect transistors (FinFETs). Methods and structures for further improving the drive currents on the FinFETs are currently being studied.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed in the present disclosure are illustrative, and do not limit the scope of the present disclosure.

A Fin Field-Effect Transistor (FinFET) and the method of forming the same are provided in accordance with various exemplary embodiments. The intermediate stages of forming the FinFET are illustrated. The variations of the embodiments are discussed. Throughout the various views and illustrative embodiments, like reference numbers are used to designate like elements.

Figure 1:
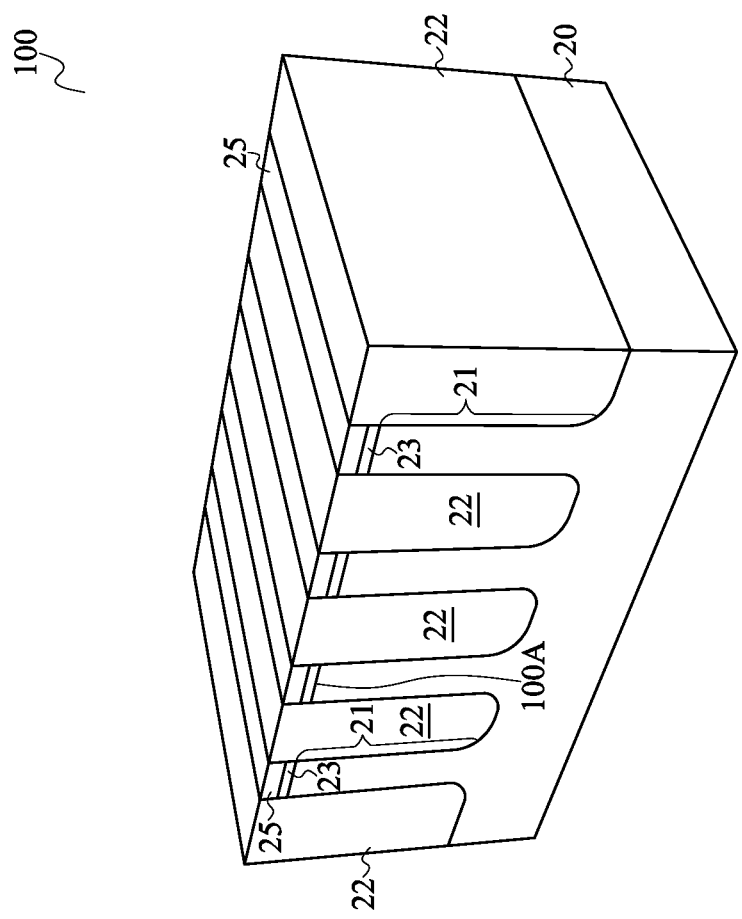
FIGS. 1 through 9B are cross-sectional views and perspective views of intermediate stages in the manufacturing of a Fin Field-Effect Transistor (FinFET) in accordance with some exemplary embodiments.

FIGS. 1 through 9B are perspective views and cross-sectional views of intermediate stages in the manufacturing of a FinFET in accordance with some exemplary embodiments. FIG. 1 illustrates a perspective view of an initial structure. The initial structure includes wafer 100, which includes substrate 20. Substrate 20 may be a semiconductor substrate, which may further be a silicon substrate. Substrate 20 may be doped with a p-type or an n-type impurity. Isolation regions such as Shallow Trench Isolation (STI) regions 22 may be formed to extend from a top surface of substrate 20 into substrate 20, wherein the top surface of substrate 20 may also be a major surface 100A of wafer 100. The portions of substrate 20 between neighboring STI regions 22 are referred to as semiconductor strips 21. The top surfaces of STI regions 22 may be leveled with the top surfaces of hard mask layers 25, which are used as a Chemical Mechanical Polish (CMP) stop layer during the formation of STI regions 22. Pad oxide layers 23 are formed between hard mask layers 25 and semiconductor strips 21.

Figure 2:
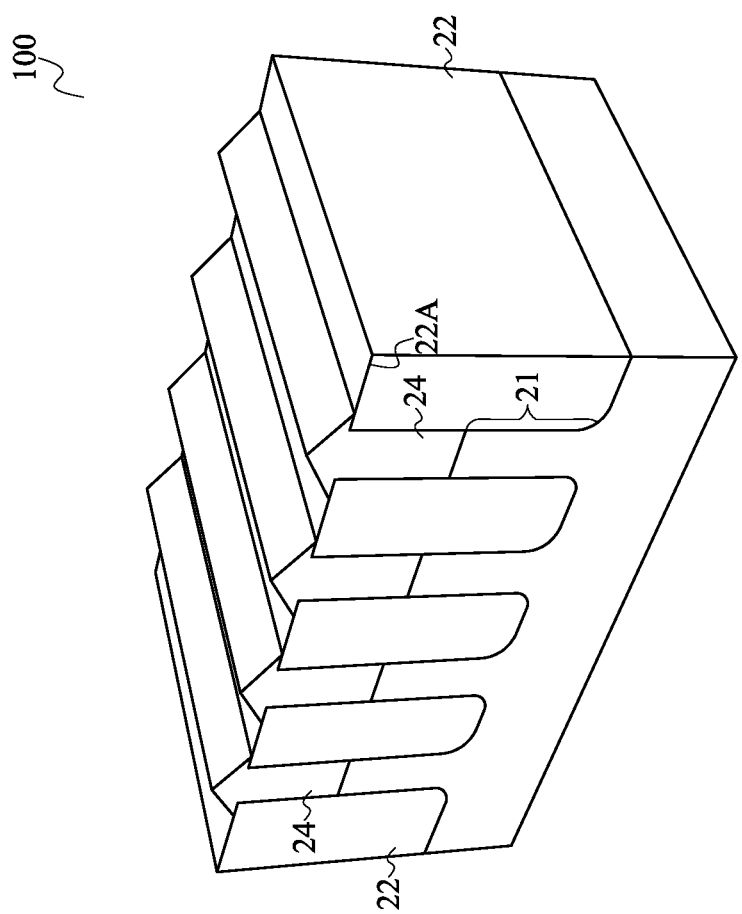

FIG. 2 illustrates the replacement of the top portion of semiconductor strips 21 in FIG. 1 with silicon germanium strips 24. In the replacement of semiconductor strips 21, pad oxide layers 23 and hard mask layers 25 are removed first. At least the top portions, or substantially entireties, of semiconductor strips 21 are then removed to form recesses (not shown, occupied by silicon germanium strips 24). Next, an epitaxy is performed to epitaxially grow silicon germanium strips 24 in the recesses, forming the structure in FIG. 2. In some embodiments, silicon germanium strips 24 have a germanium atomic percentage between about 15 percent and about 60 percent, although the germanium atomic percentage may also be higher or lower. Silicon germanium strips 24 are grown to a level higher than the top surfaces of STI regions 22. Next, a planarization step such as a CMP is performed to level the top surfaces of silicon germanium strips 24 with the top surfaces of STI regions 22. During the epitaxy of silicon germanium strips 24, an n-type impurity such as phosphorous or arsenic may be in-situ doped with the proceeding or the epitaxy.

Figure 3:
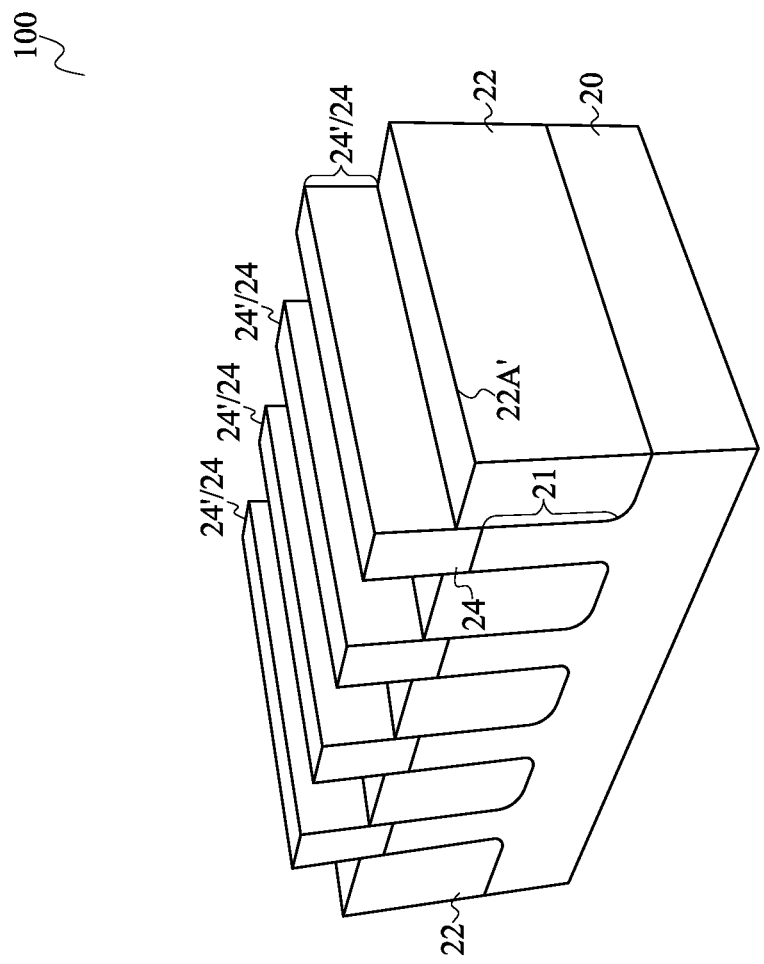

Referring to FIG. 3, STI regions 22 are recessed, so that the top portions of silicon germanium strips 24 are higher than the top surfaces of STI regions 22 to form silicon germanium fins 24'. In accordance with some embodiments, the interface between silicon germanium strips 24 and the underlying remaining portions of semiconductor strips 21 are lower than the top surface 22A' of the recessed STI regions 22.

Figure 4:
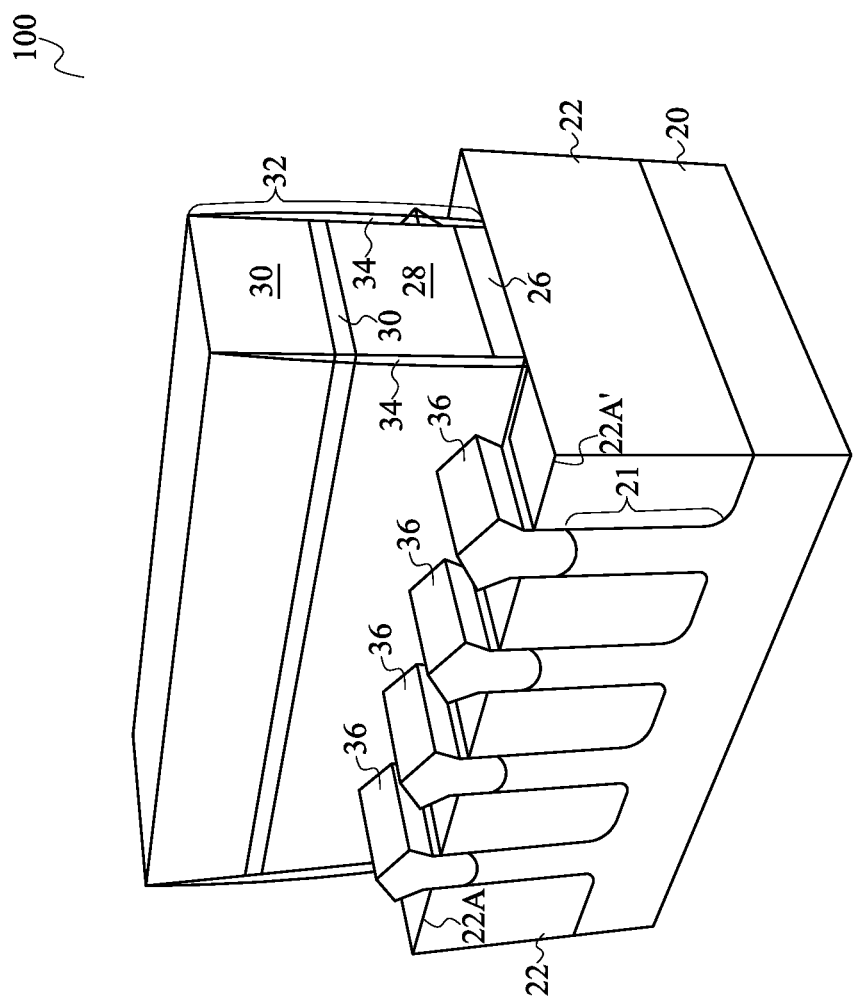

Referring to FIG. 4, gate stack 32 is formed on the top surface and the sidewalls of silicon germanium fins 24'. In some embodiments, gate stack 32 includes gate dielectric 26, and gate electrode 28 over gate dielectric 26. Gate electrode 28 may be formed, for example, using polysilicon, although other materials such as metal silicides, metal nitrides, or the like, may also be used. Gate stack 32 may also comprise hard mask layer 30 over gate electrode 28. Hard mask layer 30 may include silicon nitride, for example, and may be a single layer or a composite layer including a plurality of layers. Gate stack 32 may cross over a plurality of silicon germanium fins 24' and/or STI regions 22. Gate stack 32 may also have a lengthwise direction substantially perpendicular to the lengthwise direction of silicon germanium fins 24'. In accordance with the embodiments of the present disclosure, gate stack 32 is a dummy gate stack, and will be replaced by a replacement gate in a subsequent step.

Next, as also shown in FIG. 4, gate spacers 34 are formed on the sidewalls of gate stack 32. In some embodiments, gate spacers 34 comprise silicon oxide, silicon nitride, or the like, and may have a multi-layer structure.

Referring also to FIG. 4, an etching step is performed to etch the portions of silicon germanium strip 24 (FIG. 3) that are not covered by gate stack 32 and gate spacers 34. Next, epitaxy regions 36 are formed by selectively growing a semiconductor material in the recesses left by the removed portions of silicon germanium strips 24. In some exemplary embodiments, epitaxy regions 36 comprise silicon germanium with a germanium percentage between about 15 percent and about 60 percent. The further epitaxial growth of epitaxy regions 36 causes epitaxy regions 36 to expand horizontally, and facets start to form. In alternative embodiments, the exposed portions of silicon germanium strips 24 are not recessed and re-grown with another semiconductor. Rather, silicon germanium strips 24 are implanted to form the source and drain regions (also referred to as 36) for the resulting FinFET. In these embodiments, however, epitaxy regions 36 do not have facets.

In some embodiments, during the growth of epitaxy regions 36, a p-type impurity such as boron is in-situ doped to form source and drain regions, which are also denoted using reference numeral 36. Alternatively, no p-type impurity is doped during the formation of epitaxy regions 36. Instead, after the epitaxy step, epitaxy regions 36 are implanted to form source and drain regions 36 on the opposite sides of gate stack 32. An anneal may be performed to activate source/drain regions 36. In some embodiments, the annealing temperature is higher than the melting temperature of the subsequently formed germanium-rich fin portions 24B (FIGS. 8A and 8B), wherein the melting temperature may be about 600° C. For example, the annealing temperature may be higher than about 800° C., and may also be about 1,000° C. or higher.

Figure 5:
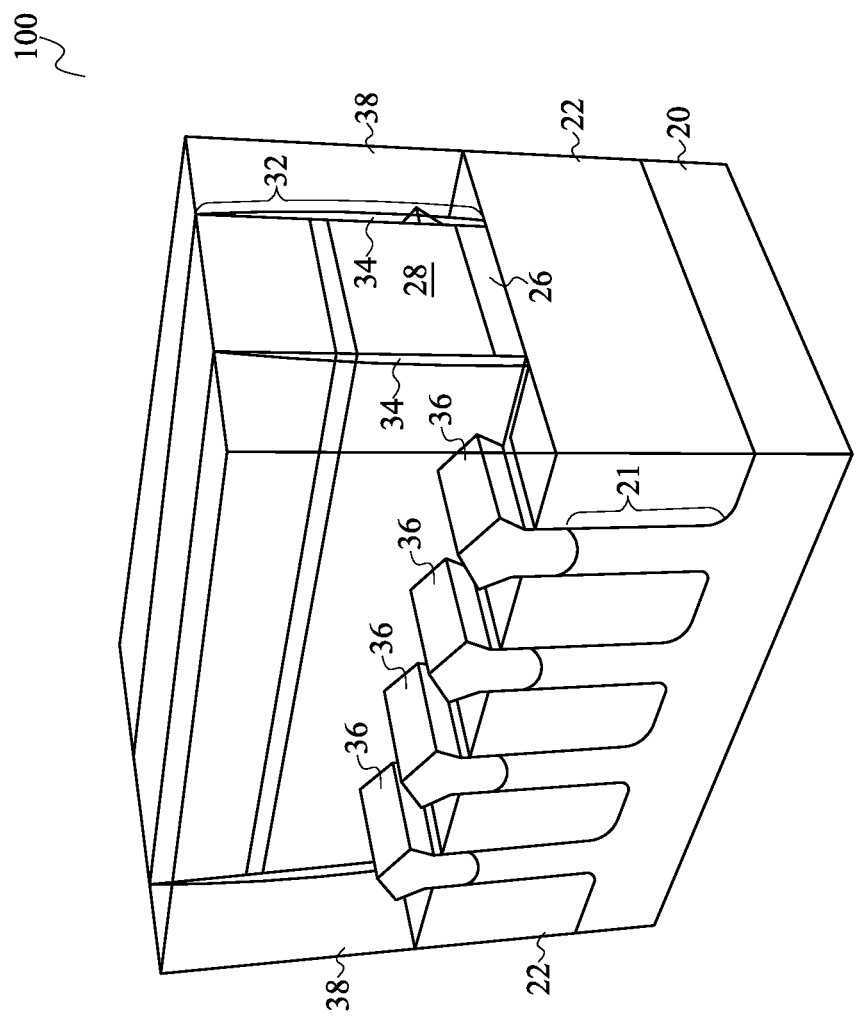

Next, as shown in FIG. 5, Inter-Layer Dielectric (ILD) 38 is formed. Although not shown, a buffer oxide layer and a Contact Etch Stop Layer (CESL) may also be formed before the formation of ILD 38. ILD 38 may comprise Flowable oxide formed using, for example Flowable Chemical Vapor Deposition (FCVD). A Chemical Mechanical Polish (CMP) may then be performed to level the top surfaces of ILD 38, gate stack 32, and gate spacers 34 with each other.

Figure 6A:
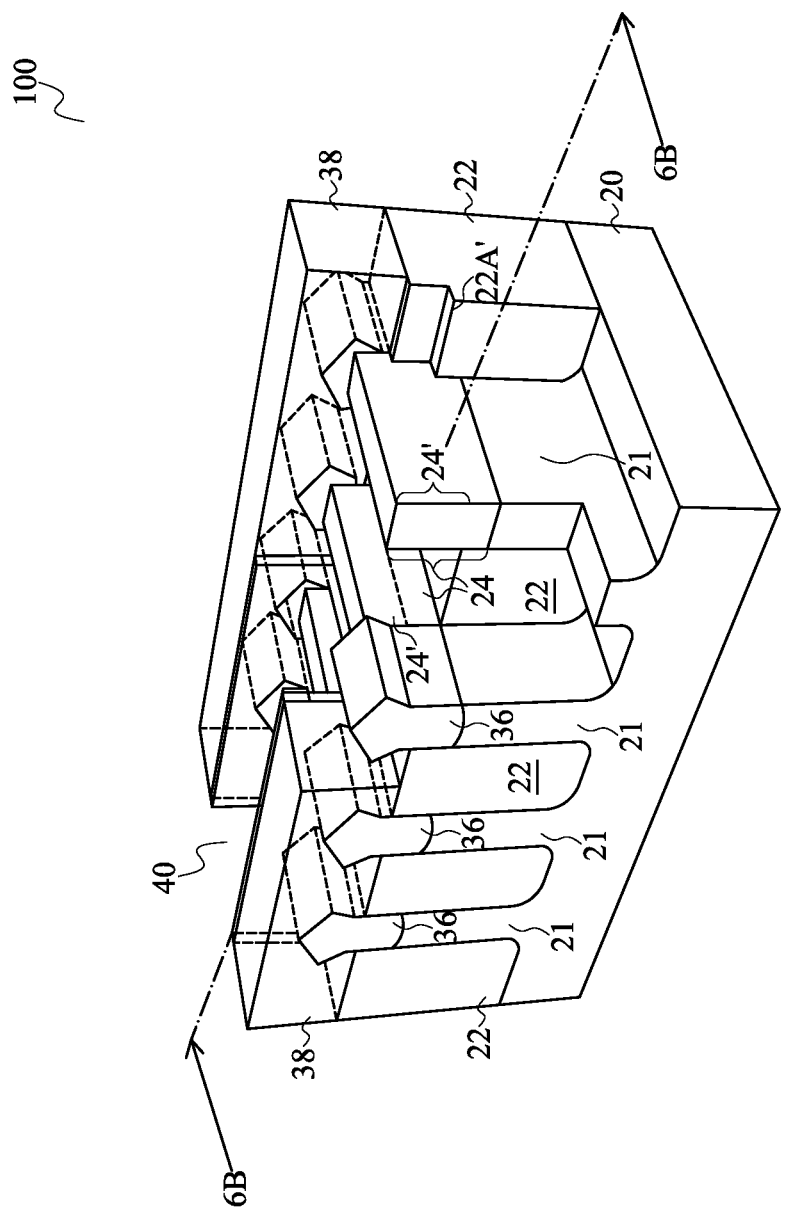

Next, dummy gate stack 32 is removed in an etching step, so that recess 40 is formed to extend into ILD 38, as shown in FIG. 6A. To illustrate the features behind the front portion of ILD 38, some front portions of ILD 38, semiconductor strips 21, source/drain regions 36, source/drain regions 36, STI regions 22, and the like are not shown in FIGS. 6A, 7A, 8A, and 9A, so that the inner features may be illustrated. It is appreciated that the un-illustrated portions of ILD 38, semiconductor strips 21, source/drain regions 36, and STI regions 22 still exist. After the removal of dummy gate stack 32, the middle portions of silicon germanium fins 24' are exposed to recess 40. During the removal of dummy gate stack 32, the bottom layer (such as the dummy gate oxide 26) of dummy gate stack 32 may be used as an etch stop layer when the top layer (such as hard mask layer 30 and dummy gate electrode 28) of dummy gate stack 32 is etched. The bottom layer of dummy gate stack 32 is removed after the removal of the top layer of dummy gate stack 32.

Figure 6B:
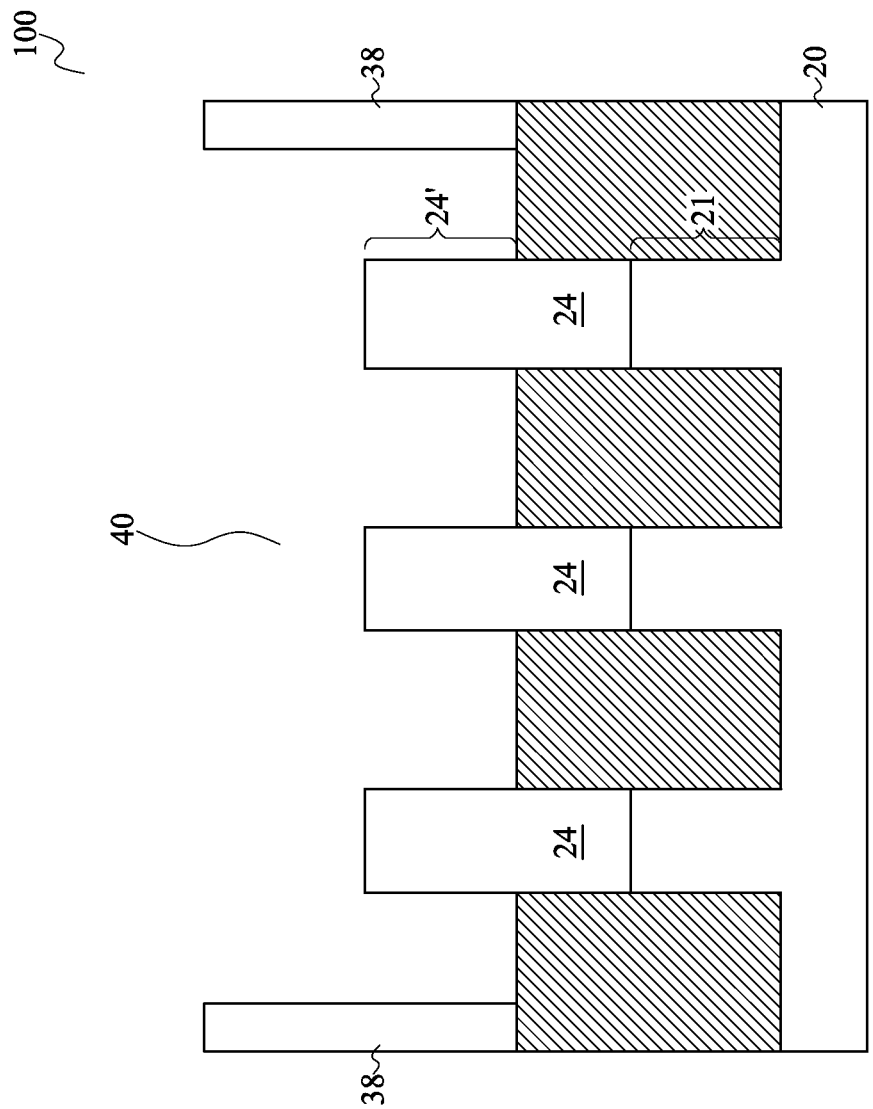

FIG. 6B illustrates a cross-sectional view of the structure in FIG. 6A, wherein the cross-sectional view is obtained from the plane containing line 6B-6B in FIG. 6A, with the plane passing through recess 40. As shown in FIG. 6B, silicon germanium fins 24' are exposed to recess 40.

Figure 7A:
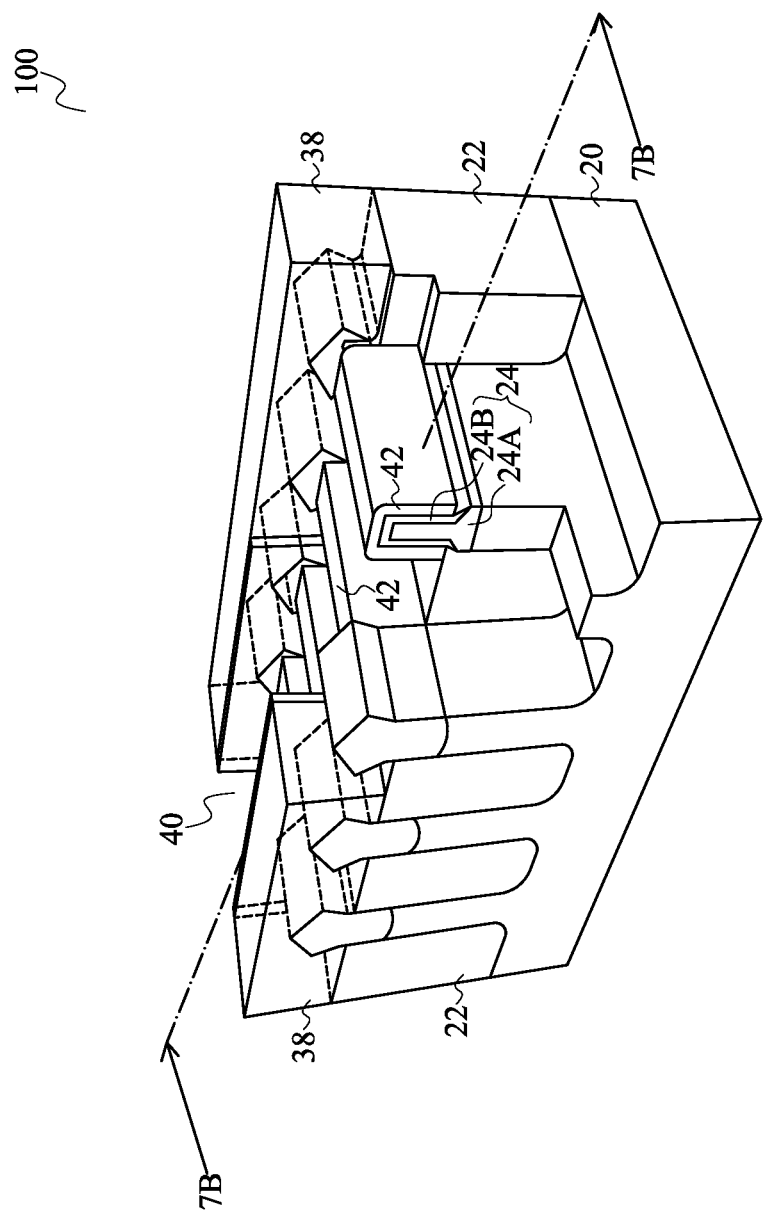
Figure 7B:
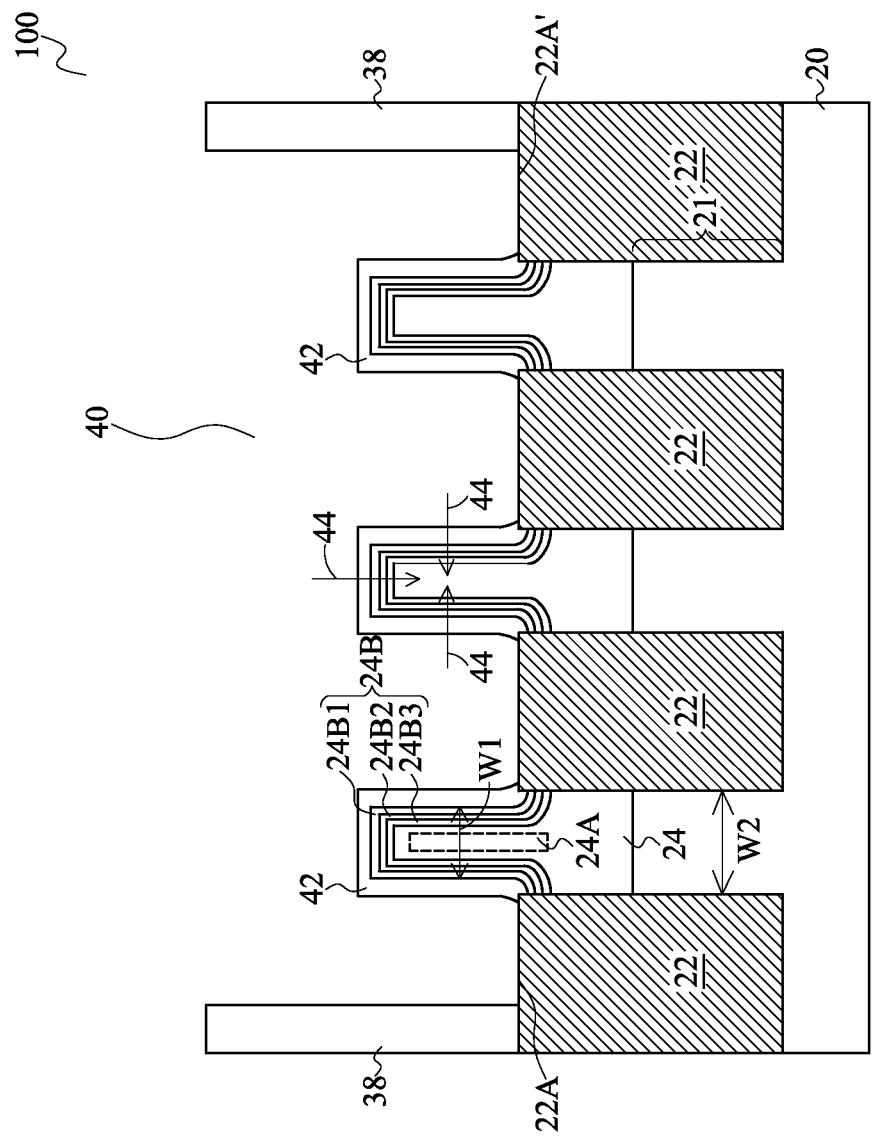

FIGS. 7A and 7B illustrate the condensation of silicon germanium fins 24', so that the germanium percentage in the channel region of the resulting FinFET is increased. In some embodiments, the condensation is performed at a temperature between about 400° C. and 600° C. by oxidizing silicon germanium fins 24' in an oxygen-containing environment. The oxygen-containing environment may include oxygen ($O_2$) therein. The oxidation of silicon in a silicon germanium region is easier than the oxidation of germanium in the same silicon germanium region. Accordingly, the silicon atoms in silicon germanium fins 24' are oxidized, and the germanium atoms in silicon germanium fins 24' remain substantially un-oxidized. The germanium atoms may diffuse inwardly toward the centers of silicon germanium fins 24', while the silicon atoms may diffuse outwardly toward the edges and the top surfaces of silicon germanium fins 24'. Accordingly, silicon oxide layers 42 are formed on the sidewalls and the top surfaces of silicon germanium fins 24', which are referred to as germanium-containing semiconductor fins 24' hereinafter.

FIG. 7B illustrates a cross-sectional view of the structure in FIG. 7A, wherein the cross-sectional view is obtained from the plane containing line 7B-7B in FIG. 7A. As shown in FIG. 7B, as a result of the oxidation, the width W1 of the remaining germanium-containing semiconductor fins 24' is smaller than width W2 of the portions of semiconductor strips 21. In some embodiments, width W1 is in the range between about 4 nm and about 10 nm, and width W2 is in the range between about 6 nm and about 12 nm. The difference W2−W1 may also be greater than about 1 nm, or greater than about 2 nm.

The oxidation results in the increase in the germanium concentration of the top portions and the sidewall surface portions of germanium-containing semiconductor fins 24'. After the oxidation, the germanium concentrations of the top portions and the sidewall surface portions 24B (also referred to as germanium-rich portions 24B hereinafter) are higher than the inner portions 24A of germanium-containing semiconductor fins 24'. The germanium percentage of center portions 24A may be equal to the germanium percentage of the silicon germanium fins 24' before the oxidation is performed. Germanium-rich portions 24B may have germanium percentages between about 45 percent and about 100 percent. Furthermore, germanium-rich portions 24B have a gradient germanium percentage, with the germanium percentage of the outmost portion being the highest. In the directions of arrows 44, the germanium percentages gradually and continuously decrease, until the germanium percentage is reduced to the germanium percentage of center portions 24A. Layers 24B1, 24B2, and 24B3 are schematically illustrated to show the layers that have increasingly reduced germanium percentages. Furthermore, germanium-rich portions 24B that have the increased germanium percentages extend to below the top surface 22A' of STI regions 22, for example, for a depth between about 1 nm and about 3 nm.

Figure 8A:
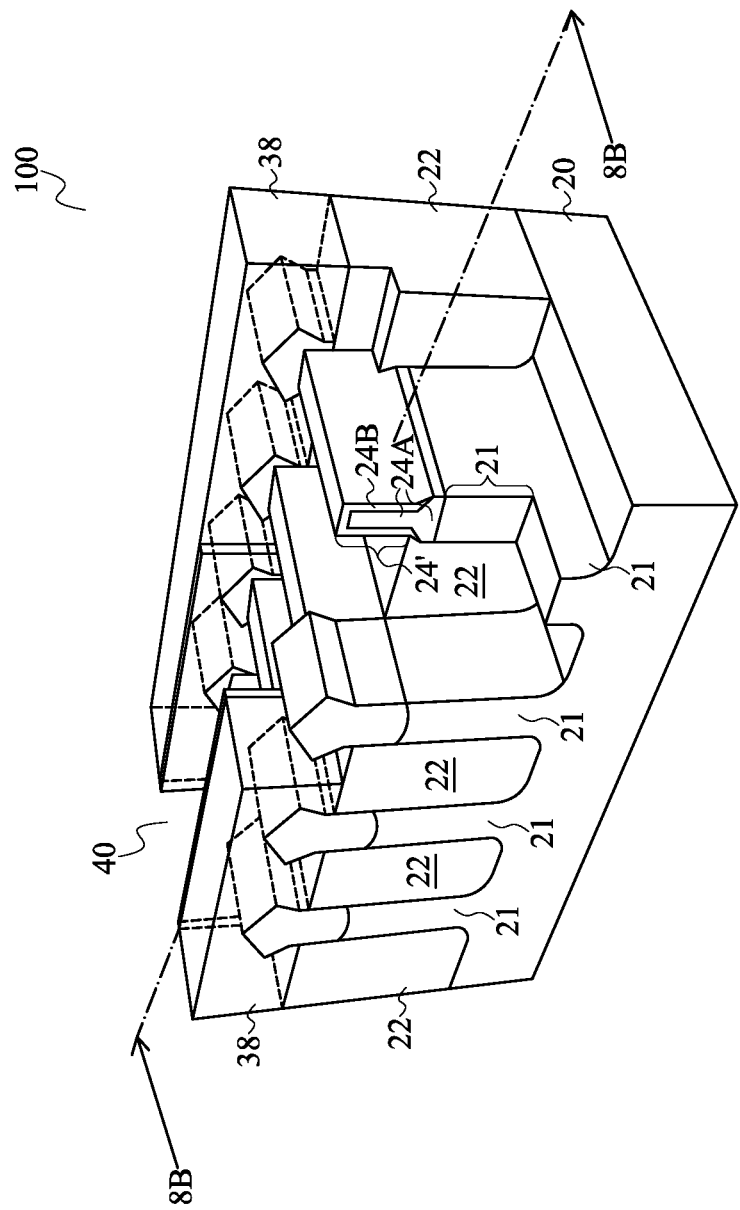
Figure 8B:
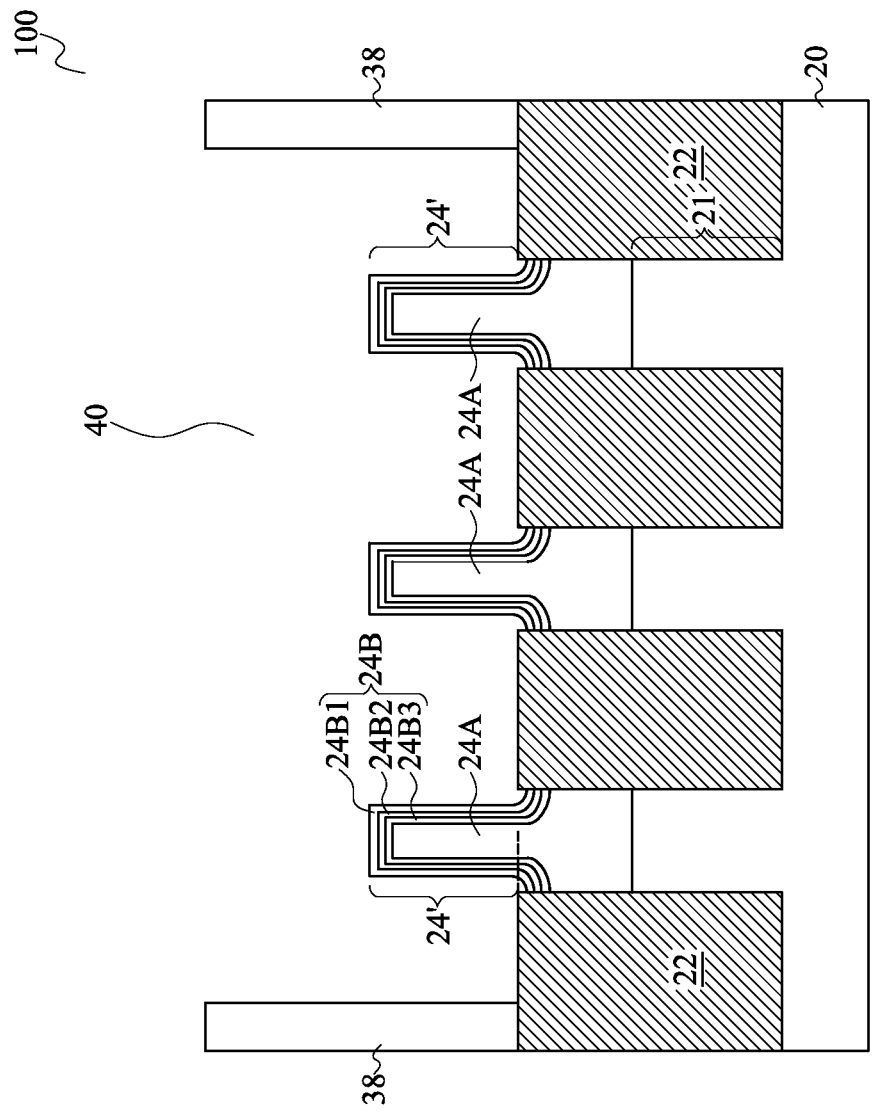

Next, silicon oxide layer 42 is removed, and germanium-containing semiconductor fins 24' are exposed, as shown in FIGS. 8A and 8B. FIGS. 8A and 8B illustrate a perspective view and a cross-sectional view, respectively, wherein the cross-sectional view in FIG. 8B is obtained from the vertical plane containing line 8B-8B in FIG. 8A.

Figure 9A:
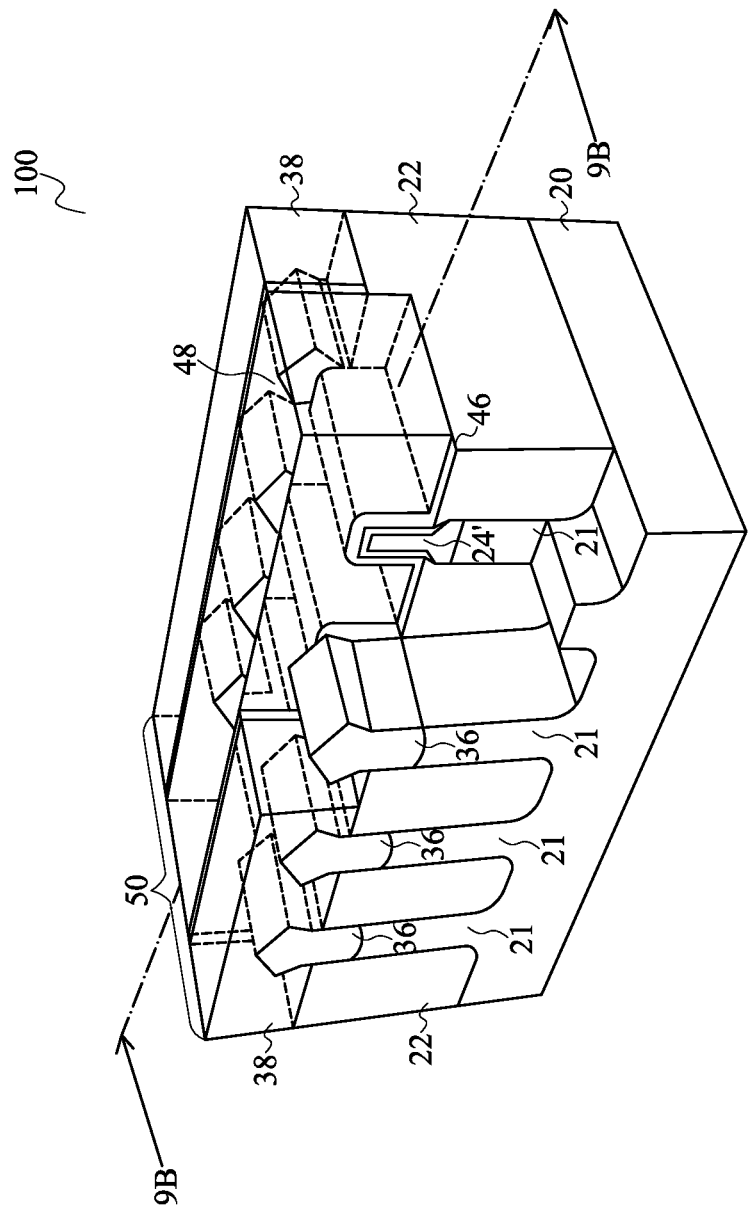
Figure 9B:
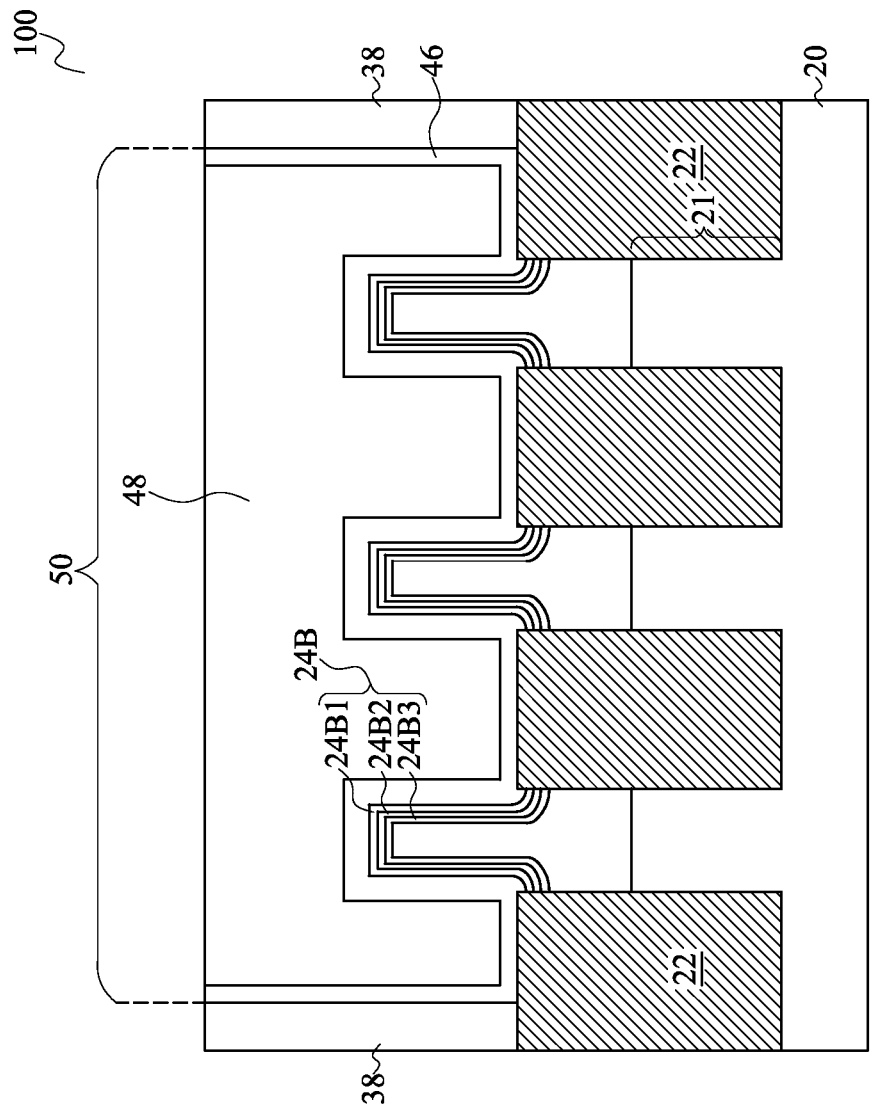

FIGS. 9A and 9B illustrate the formation of a replacement gate comprising gate dielectric 46 and gate electrode 48. FIGS. 9A and 9B illustrate a perspective view and a cross-sectional view, respectively, wherein the cross-sectional view in FIG. 9B is obtained from the vertical plane containing line 9B-9B in FIG. 9A. The intermediate stages in the formation of gate dielectric 46 and gate electrode 48 are not illustrated, and are described briefly below referring to FIGS. 9A and 9B. In some embodiments, a silicon cap (not shown) may (or may not) be formed on germanium-containing semiconductor fins 24' first. Gate dielectric layer 46 is then formed as a blanket layer in recess 40 (FIGS. 8A and 8B) and on the top surfaces and the sidewalls of germanium-containing semiconductor fins 24' and ILD 38. In accordance with some embodiments, gate dielectric layer 46 comprises silicon oxide, silicon nitride, or multilayers thereof. In alternative embodiments, gate dielectric layer 46 comprises a high-k dielectric material. In which embodiments, gate dielectric layer 46 may have a k value greater than about 7.0, and may include a metal oxide or a silicate of Hf, Al, Zr, La, and the like. Next, conductive material 48 is formed over gate dielectric layer 46, and fills the remaining recess 40 (FIG. 8A). Conductive material 48 may comprise a metal-containing material such as TiN, TaN, TaC, Co, Ru, Al, Cu, W, combinations thereof, or multi-layers thereof. After the filling of conductive material 48, a CMP may be performed to remove the excess portions of gate dielectric layer 46 and conductive material 48, which excess portions are over the top surface of ILD 38. The resulting remaining portions of conductive material 48 and gate dielectric layer 46 thus form a replacement gate for the resulting FinFET 50.

FIGS. 10 through 18B illustrate cross-sectional views and perspective views of intermediate stages in the formation of a FinFET in accordance with alternative embodiments. Unless specified otherwise, the materials and the formation methods of the components in these embodiments are essentially the same as the like components, which are denoted by like reference numerals in the embodiments shown in FIGS. 1 through 9B. The details regarding the formation process and the materials of the components shown in FIGS. 10 through 18B may thus be found in the discussion of the embodiment shown in FIGS. 1 through 9B.

Figure 10:
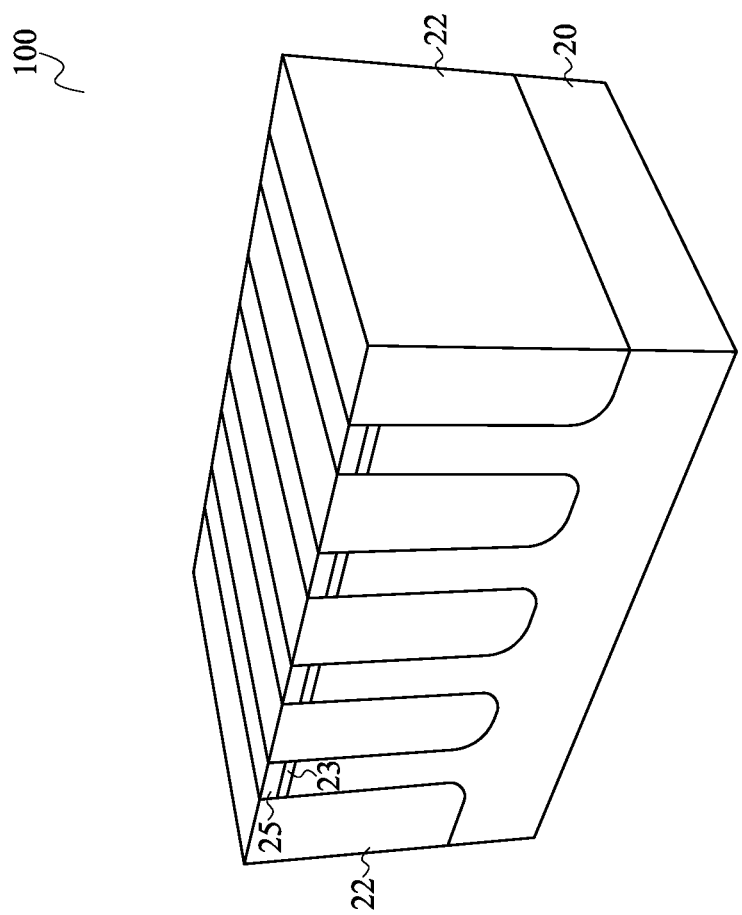
FIGS. 10 through 18B are cross-sectional views and perspective views of intermediate stages in the manufacturing of a FinFET in accordance with alternative embodiments.
Figure 11:
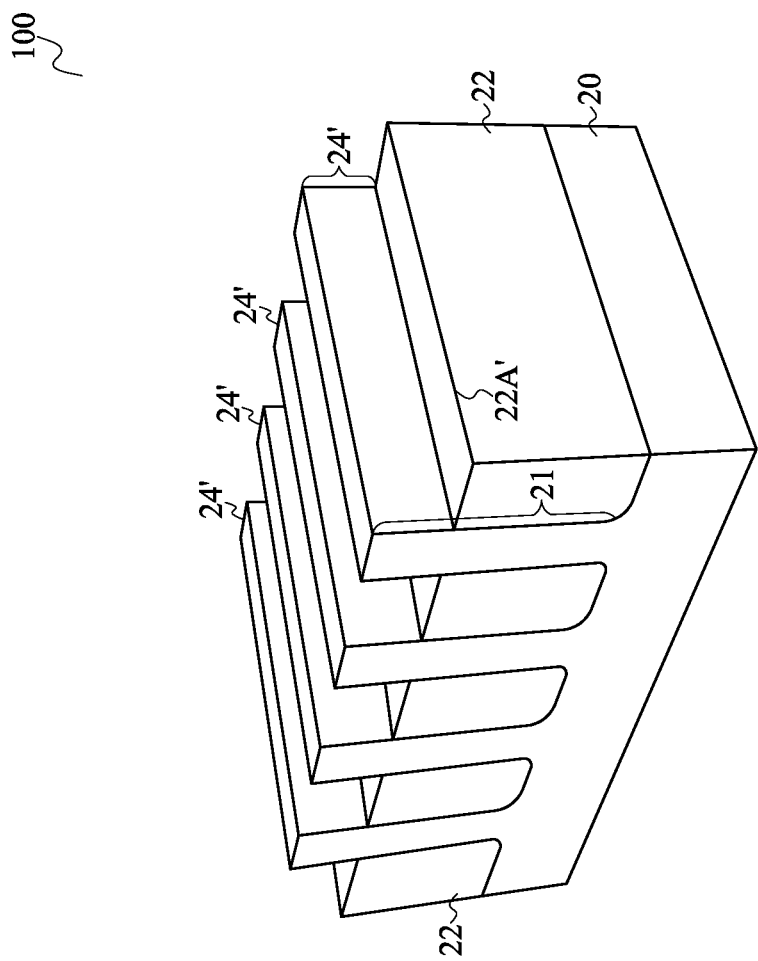

FIGS. 10 through 13 illustrate a process similar to the process in FIGS. 1 through 5. In these embodiments, however, the process step (FIG. 2) for replacing the top portions of semiconductor strips 21 with silicon germanium strips 24 is not performed. Accordingly, semiconductor fins 24' as shown in FIG. 11 is formed of a same semiconductor material as substrate 20, which semiconductor material may be crystalline silicon or crystalline silicon carbon, and may be free from germanium.

The process steps shown in FIGS. 10 through 14 are briefly described herein, and the details of the materials and the process details may be found referring to the embodiments shown in FIGS. 1 through 5. Referring to FIG. 10, STI regions 22 are formed to extend into semiconductor substrate 20, wherein semiconductor strips 21, which are portions of the original semiconductor substrate 20, are located between STI regions 22. Pad oxide layers 23 and hard mask layers 25 are formed to assist the formation of STI regions 22. Next, in FIG. 11, pad oxide layers 23 and hard mask layers 25 are removed, and STI regions 22 are recessed. The top portions of semiconductor strips 21 are referred to as silicon fins 24' hereinafter.

Figure 12:
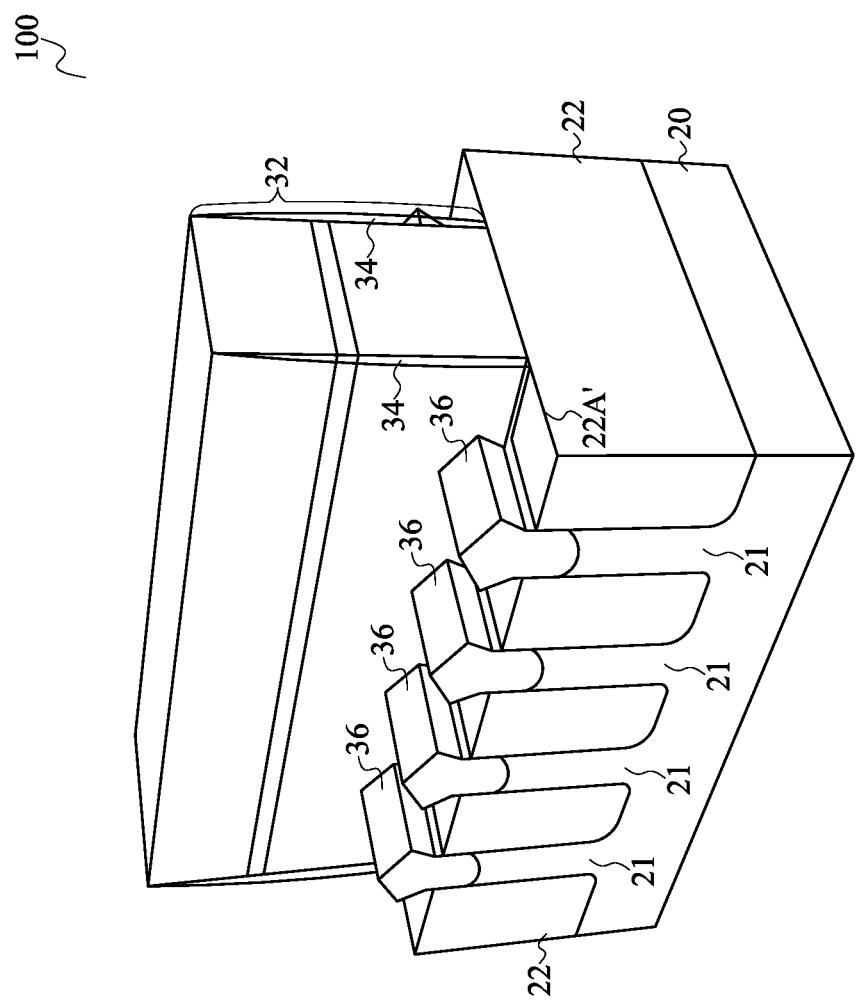
Figure 13:
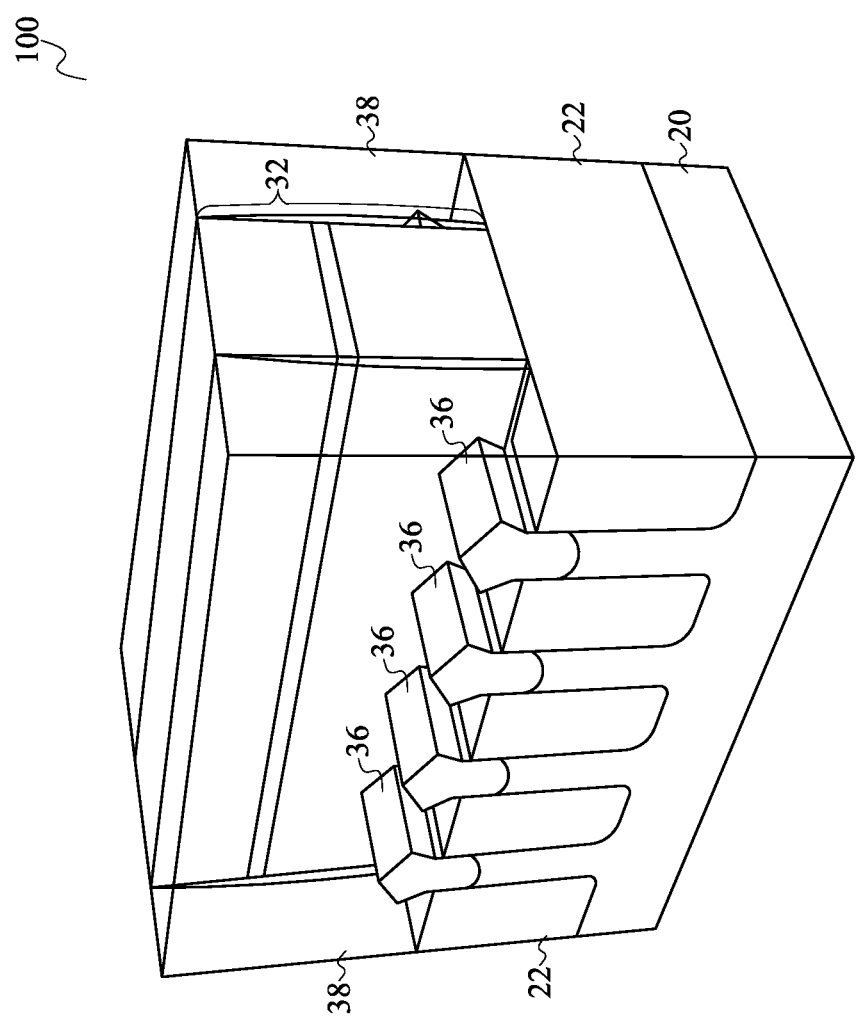
Figure 16A:
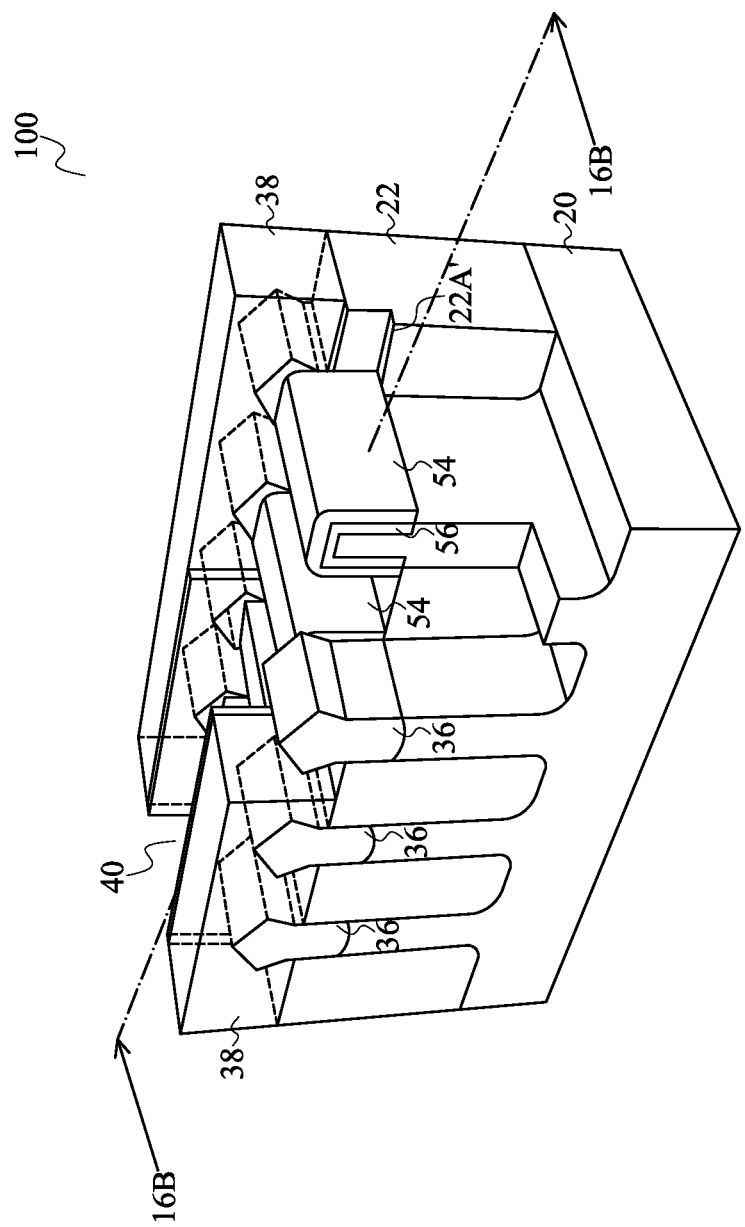

FIG. 12 illustrates the formation of dummy gate stack 32 and gate spacers 34. Gate stack 32 may include dummy oxide 26, dummy gate electrode 28, and hard mask layer 30. After the formation of dummy gate stack 32 and gate spacers 34, source and drain regions 36 are formed. An exemplary formation process include etching the portions of silicon fins 24' not covered by dummy gate stack 32 and gate spacers 34, and performing an epitaxy to regrow source and drain regions 36. Source and drain regions 36 may include silicon germanium in some exemplary embodiments. An annealing may then be performed to activate source/drain regions 36. The annealing step may be performed at a temperature (such as 800° C. to about 1,000° C.) higher than the melting temperature (such as around 600° C.) of the subsequently formed germanium-rich layer 56 (FIG. 16A). ILD 38 is then formed, as shown in FIG. 13.

Figure 14:
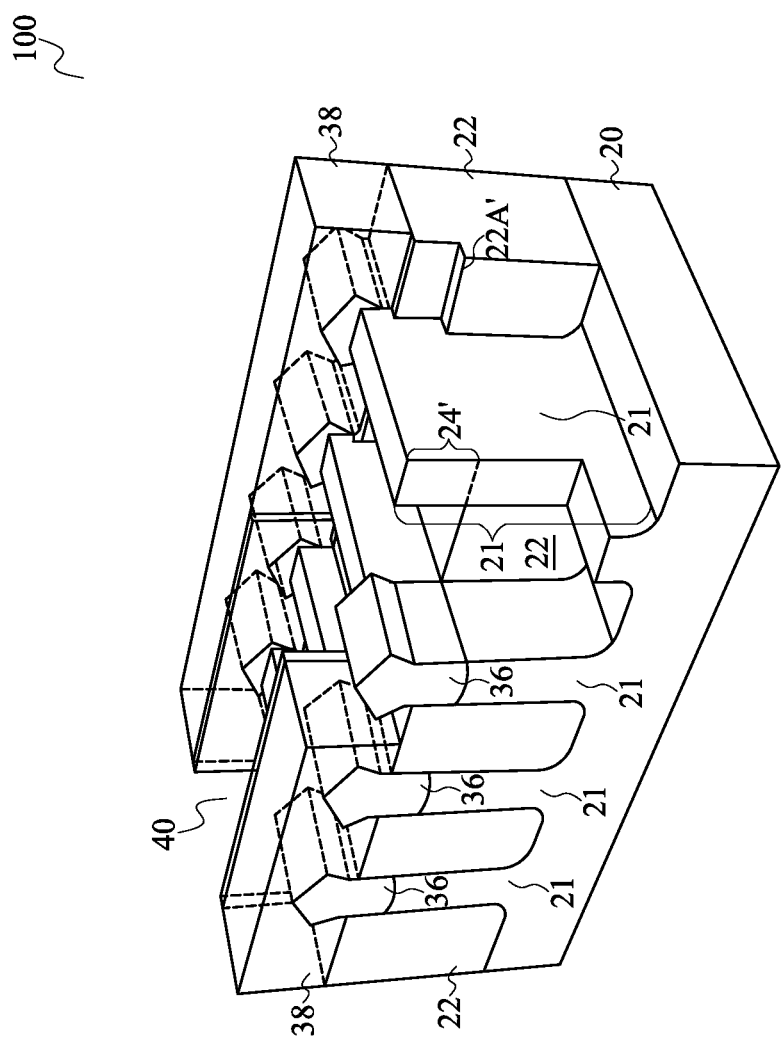
Figure 15A:
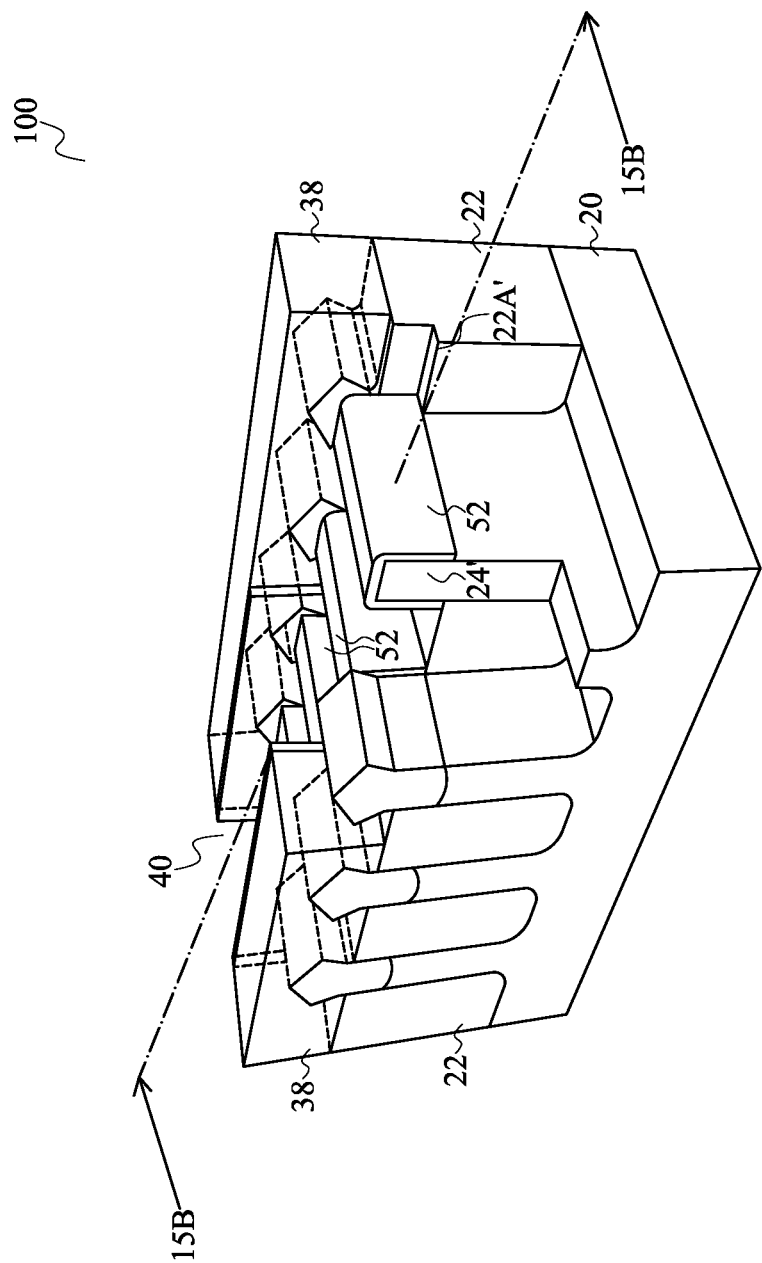
Figure 15B:
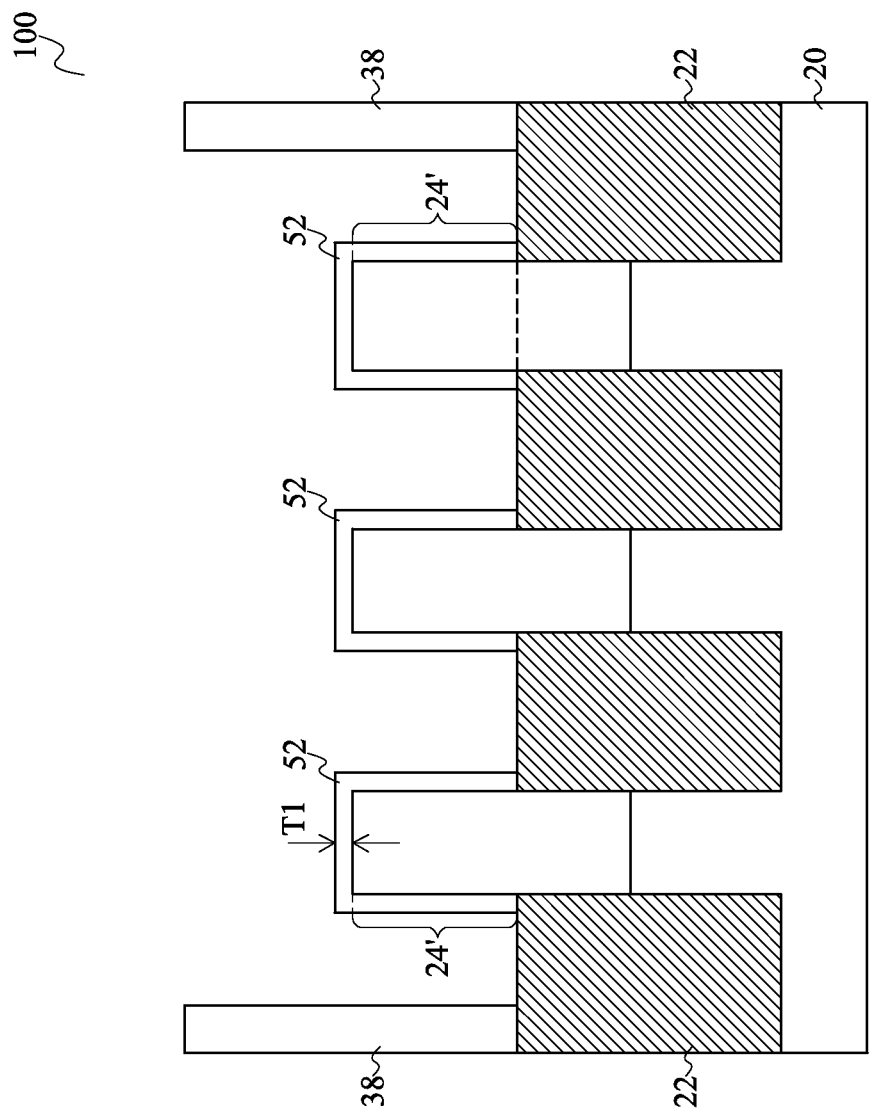

Next, dummy gate stack 32 is removed to form recess 40, as shown in FIG. 14. Accordingly, silicon fins 24' are exposed. FIGS. 15A and 15B illustrate a perspective view and a cross-sectional view, respectively, of the epitaxy for forming silicon germanium layer 52 on the exposed top surfaces and sidewalls of silicon fins 24'. The cross-sectional view in FIG. 15B is obtained from the plane containing line 15B-15B in FIG. 15A. In some embodiments, silicon germanium layers 52 have a germanium concentration between about 15 percent and about 60 percent, although the germanium percentage may be higher or lower. Thickness T1 (FIG. 15B) of silicon germanium layer 52 may be between about 10 nm and about 30 nm.

Figure 16B:
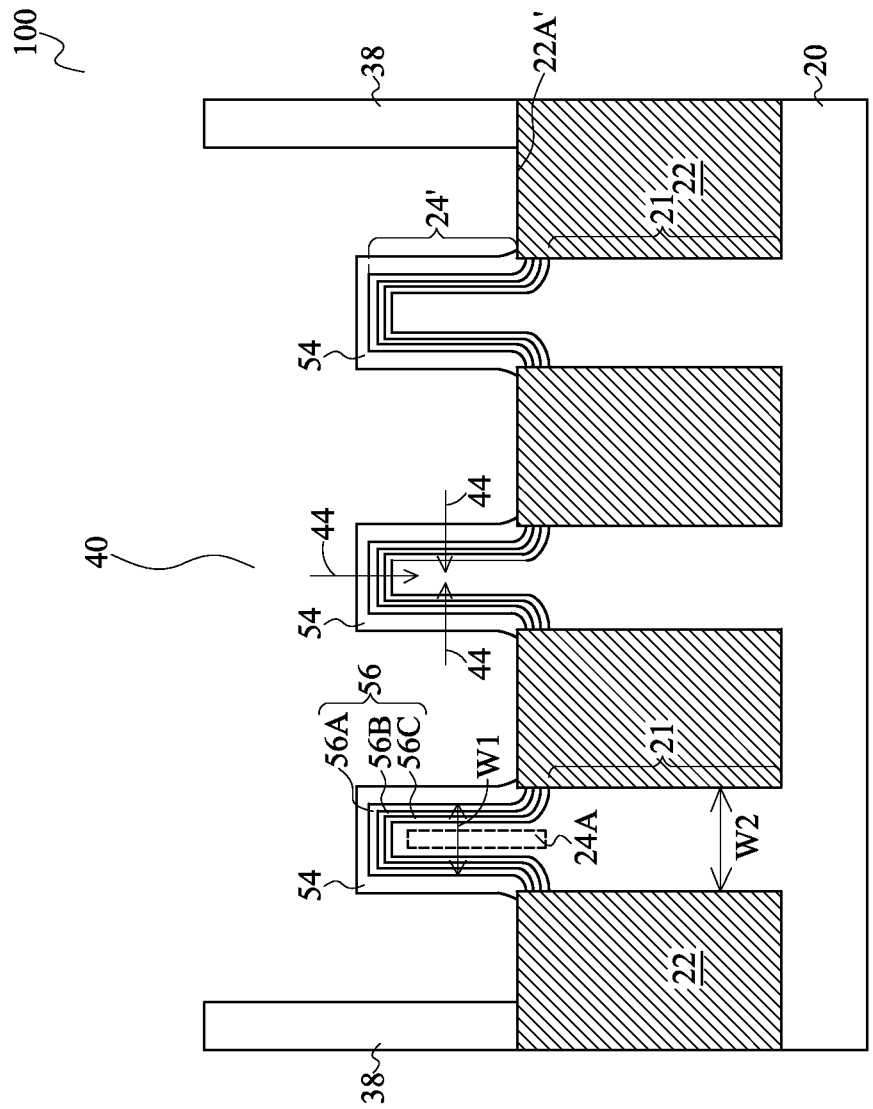

Next, an oxidation is performed to oxidize the silicon in silicon germanium layer 52, so that the germanium atoms in silicon germanium layer 52 are condensed. The resulting structure is shown in FIGS. 16A and 16B, which are a perspective view and a cross-sectional view, respectively. In the oxidation, the germanium atoms in silicon germanium layer 52 also diffuse inwardly. Accordingly, germanium-containing semiconductor layer 56 is formed inside silicon oxide layer 54, and the germanium percentage in germanium-containing layer 56 is increased to higher than the germanium percentage in silicon germanium layer 52. Accordingly, germanium-containing layers 56 are alternatively referred to as germanium-rich layers 56. Germanium-containing semiconductor layer 56 may have germanium percentages between about 45 percent and about 100 percent. Furthermore, germanium-containing semiconductor layer 56 has a gradient germanium percentage, with the germanium percentage of the outmost portion being the highest. The cross-sectional view in FIG. 16B is obtained from the plane containing line 16B-16B in FIG. 16A. In the directions of arrows 44, the germanium percentages gradually and continuously decrease, until the germanium percentage is reduced to, for example, zero percent in center region 24A. Layers 56A, 56B, and 56C are schematically illustrated to show the layers that have different germanium percentages. Furthermore, germanium-containing semiconductor layers 56 may extend to below the top surface 22A' of STI regions 22, for example, for the depth between about 1 nm and about 5 nm.

As shown in FIG. 16B, as a result of the oxidation, the width W1 of the remaining germanium-containing semiconductor fins 24' may be smaller than width W2 of the portions of semiconductor strips 21. In the embodiments that thickness T1 of silicon germanium layer 52 (FIG. 15B) is great enough, width W1 may also be equal to or greater than width W2. In some embodiments, width W1 is in the range between about 4 nm and about 10 nm, and width W2 is in the range between about 6 nm and about 12 nm. The difference W2–W1 may also be greater than about 1 nm.

Figure 17:
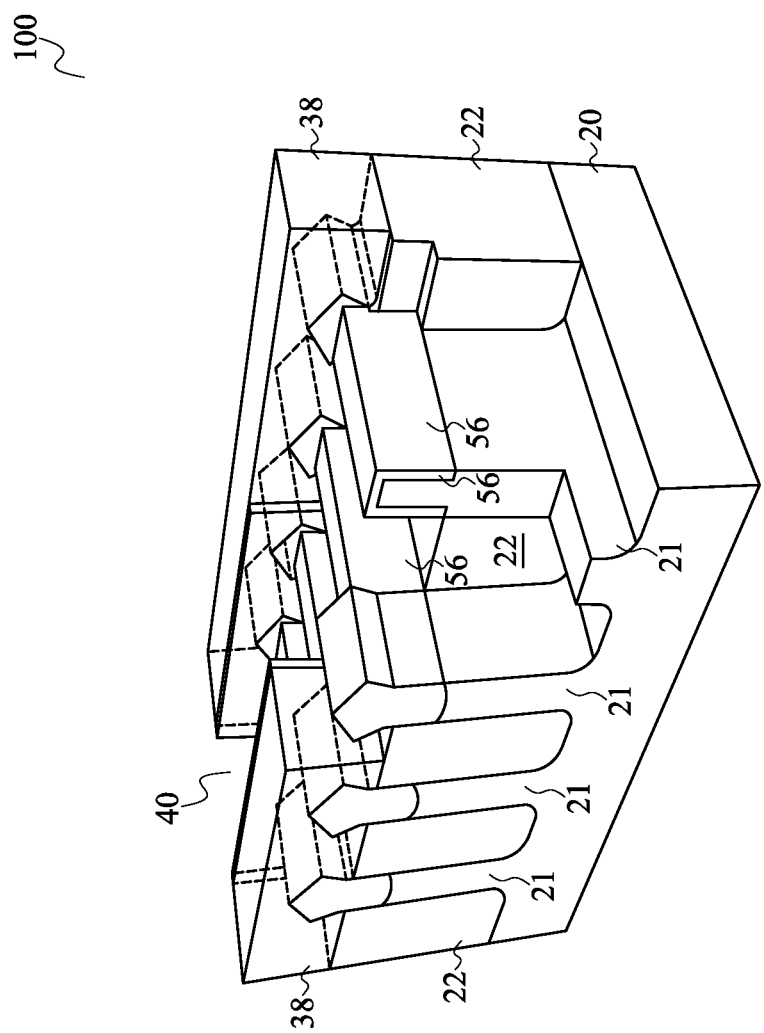

Next, as shown in FIG. 17, silicon oxide layer 54 is removed, and germanium-containing semiconductor layer 56 is exposed.

Figure 18A:
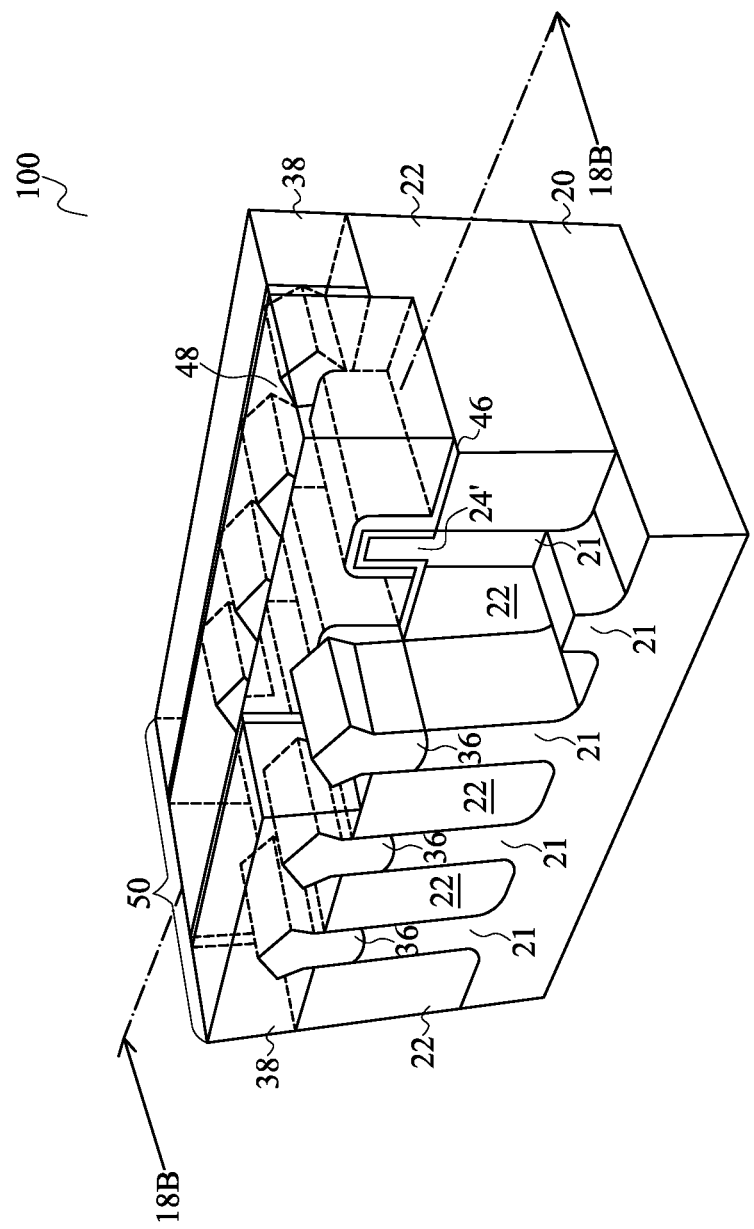
Figure 18B:
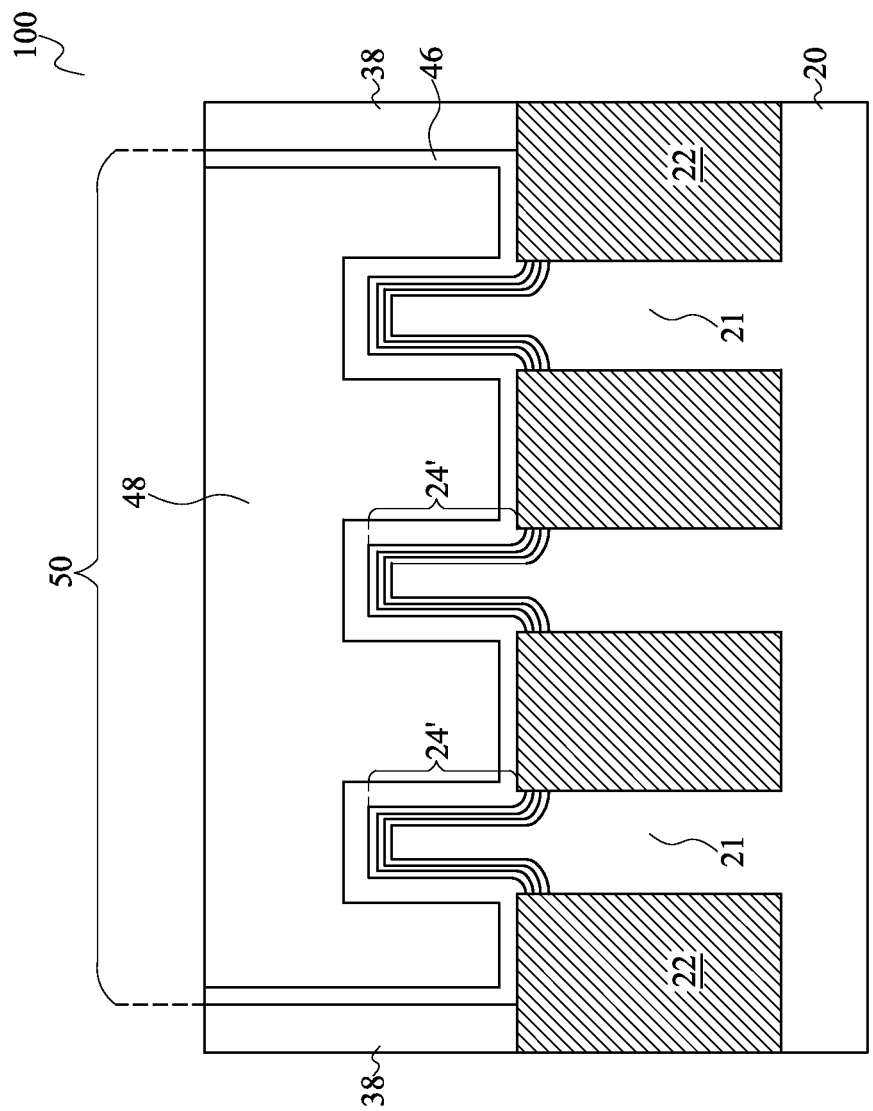

FIGS. 18A and 18B illustrate a perspective view and a cross-sectional view, respectively, of the formation of the replacement gate, which comprises gate dielectric 46 and gate electrode 48. The details of the materials and the formation processes are essentially the same as in FIGS. 9A and 9B, and are not repeated herein. FinFET 50 is thus formed.

In the embodiments of the present disclosure, the formation of the germanium-rich layers is performed after the formation of source and drain regions, wherein the germanium-rich layers are formed through germanium condensation. Germanium-rich layers, when having germanium percentage greater than about 60 percent, have a low melting point of around 600° C. Therefore, if the germanium-rich fins are formed in the early stage of the formation of FinFET, there will be problems (which occurred in the conventional processes) since various process steps (such as source/drain activation) in the formation of FinFETs adopt high temperatures as high as about 1,000° C. In the embodiments of the present disclosure, since the increase of the germanium percentage is performed after all of the high temperature processes have been finished, the process of the present disclosure is compatible with the existing FinFET formation processes.

In accordance with some embodiments, a method includes forming a semiconductor fin, forming a dummy gate on a top surface and sidewalls of the semiconductor fin, and removing the dummy gate to form a recess. The semiconductor fin is exposed to the recess. After the dummy gate is removed, an oxidation is performed on the semiconductor fin to form a condensed germanium-containing fin in the recess, and a silicon oxide layer on a top surface and sidewalls of the condensed germanium-containing fin. The method further includes forming a gate dielectric over the condensed germanium-containing fin, and forming a gate electrode over the gate dielectric.

In accordance with other embodiments, a method includes forming isolation regions extending into a silicon substrate, performing an epitaxy to replace a portion of the silicon substrate between the isolation regions to form a silicon germanium strip, and recessing the isolation regions. A top portion of the silicon germanium strip over the top surfaces of the recessed isolation regions forms a silicon germanium fin. A dummy gate stack is then formed on sidewalls and a top surface of the silicon germanium fin. A source/drain region is formed on a side of the dummy gate stack. An ILD is formed to cover the source/drain region. The dummy gate stack is removed to form a recess extending into the ILD. An oxidation is performed on a portion of the silicon germanium fin exposed to the recess to form a condensed germanium-containing semiconductor fin.

In accordance with yet other embodiments, an integrated circuit structure includes isolation structures extending into a semiconductor substrate, and a germanium-containing semiconductor fin higher than a top surface of the isolation structures. The germanium-containing semiconductor fin includes a center portion having a first germanium percentage, and sidewall portions on the opposite sides of the center portion. The sidewall portions have gradient germanium percentages, with outer portions of the sidewall portions having higher germanium percentages than respective inner portions. A gate dielectric is formed on sidewalls and a top surface of the germanium-containing semiconductor fin. A gate electrode is formed over the gate dielectric.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a silicon fin;
   forming a dummy gate on a top surface and sidewalls of the silicon fin;
   removing the dummy gate to form a recess, wherein the silicon fin is exposed to the recess;
   forming a silicon germanium layer on sidewalls and a top surface of the silicon fin;
   after the removing the dummy gate, performing an oxidation on the silicon germanium layer to form:
     a condensed germanium-containing fin in the recess; and
     a silicon oxide layer on a top surface and sidewalls of the condensed germanium-containing fin, wherein the oxidation is performed at a temperature between about 400° C. and about 600° C.;
   removing the silicon oxide layer;
   forming a gate dielectric over the condensed germanium-containing fin; and
   forming a gate electrode over the gate dielectric.

2. The method of claim 1 further comprising:
   forming source and drain regions on opposite sides of the dummy gate; and
   before the removing the dummy gate, forming an Inter-Layer Dielectric (ILD) to cover the source and drain regions.

3. The method of claim 2 further comprising, before the oxidation, performing an annealing.

4. The method of claim 3, wherein the annealing is performed at a temperature higher than a melting temperature of the condensed germanium-containing fin.

5. The method of claim 1, wherein in the oxidation, germanium diffuses into the silicon fin to form the condensed germanium-containing fin.

6. The method of claim 1, wherein in the oxidation, an entirety of the silicon germanium layer is converted to silicon oxide, with germanium in the silicon germanium layer driven into the silicon fin.

7. The method of claim 1, wherein the condensed germanium-containing fin comprises:
   a center portion having a first germanium concentration; and
   outer portions on opposite sides of the center portion, wherein the outer portions have a second germanium concentration higher than the first germanium concentration.

8. The method of claim 1, wherein the condensed germanium-containing fin has a germanium percent between about 45 percent and about 100 percent.

9. A method comprising:
   forming isolation regions extending into a silicon substrate;
   performing an epitaxy to replace a portion of the silicon substrate between the isolation regions to form a silicon germanium strip having a first germanium concentration;
   recessing the isolation regions, wherein a top portion of the silicon germanium strip over top surfaces of the recessed isolation regions forms a silicon germanium fin;
   forming a dummy gate stack on sidewalls and a top surface of the silicon germanium fin;
   forming a source/drain region on a side of the dummy gate stack;
   forming an Inter-Layer Dielectric (ILD) to cover the source/drain region;
   removing the dummy gate stack to form a recess in the ILD; and
   performing an oxidation on a portion of the silicon germanium fin exposed to the recess to form a condensed germanium-containing semiconductor fin comprising:

a center portion having the first germanium concentration; and outer portions on opposite sides of the center portion, wherein the outer portions have a second germanium concentration higher than the first germanium concentration.

10. The method of claim 9 further comprising:

forming a replacement gate in the recess, wherein the replacement gate and the source/drain region form parts of a Fin Field-Effect Transistor (FinFET).

11. The method of claim 10 further comprising:

before the forming the replacement gate, removing a silicon oxide layer formed in the oxidation.

12. The method of claim 9, wherein the forming the source/drain region comprises:

recessing portions of the silicon germanium fin not covered by the dummy gate stack to form an additional recess; and epitaxially growing the source/drain region from the additional recess.

13. The method of claim 9 further comprising, before the performing the oxidation, performing an annealing at an annealing temperature higher than 800° C.

14. The method of claim 13, wherein a portion of the condensed germanium-containing semiconductor fin has a melting temperature lower than the annealing temperature.

15. The method of claim 9, wherein a portion of the condensed germanium-containing semiconductor fin has a germanium percentage higher than about 60 percent.

16. The method of claim 9, wherein the silicon germanium strip has a first germanium percentage, and wherein the condensed germanium-containing semiconductor fin has a second germanium percentage higher than the first germanium percentage.

17. The method of claim 16, wherein the condensed germanium-containing semiconductor fin has an outer portion having the second germanium percentage, and wherein a center portion of the condensed germanium-containing semiconductor fin has the first germanium percentage.

18. A method comprising:

removing a dummy gate stack over a silicon germanium fin to form an opening in a dielectric layer, wherein a sidewall and a top surface of the silicon germanium fin are exposed after the removing the dummy gate stack, and the silicon germanium fin has a first germanium concentration;

after the removing the dummy gate stack, performing an oxidation on the silicon germanium fin to form:

a germanium-containing semiconductor fin comprising:

a center portion having the first germanium concentration; and outer portions on opposite sides of the center portion, wherein the outer portions have a second germanium concentration higher than the first germanium concentration; and a silicon oxide layer on an additional top surface and additional sidewalls of the germanium-containing semiconductor fin.

19. The method of claim 18 further comprising:

after the oxidation, removing the silicon oxide layer;

forming a gate dielectric on the additional sidewalls and the additional top surface of the germanium-containing semiconductor fin; and forming a gate electrode over the gate dielectric, with the gate dielectric and the gate electrode in the dielectric layer.

20. The method of claim 18 further comprising:

before the removing the dummy gate stack, forming source and drain regions on opposite ends of the silicon germanium fin; and forming the dielectric layer covering the source and drain regions.

* * * * *